US006410360B1

(12) United States Patent
Steenberge

(10) Patent No.: US 6,410,360 B1
(45) Date of Patent: Jun. 25, 2002

(54) LAMINATE-BASED APPARATUS AND METHOD OF FABRICATION

(75) Inventor: Robert W. Steenberge, Poway, CA (US)

(73) Assignee: Teledyne Industries, Inc., Los Angeles, CA (US)

( * ) Notice: Subject to any disclaimer, the term of this patent is extended or adjusted under 35 U.S.C. 154(b) by 0 days.

(21) Appl. No.: 09/237,365

(22) Filed: Jan. 26, 1999

(51) Int. Cl.[7] ............................ B81C 3/00; H01H 50/00

(52) U.S. Cl. ............................ 438/52; 29/622; 29/874; 29/825

(58) Field of Search ................................ 156/345, 153, 156/250, 292, 263; 438/52; 29/830, 622, 825, 874

(56) References Cited

U.S. PATENT DOCUMENTS

| | | | | | |
|---|---|---|---|---|---|
| 4,112,279 A | * | 9/1978 | Brohard | ...................... | 200/181 |
| 4,764,244 A | * | 8/1988 | Chitty et al. | ................ | 156/630 |
| 4,855,544 A | | 8/1989 | Glenn | | |
| 5,048,178 A | * | 9/1991 | Bindra et al. | ................. | 29/830 |
| 5,051,643 A | | 9/1991 | Dworsky et al. | | |
| 5,273,829 A | | 12/1993 | Bassous et al. | | |
| 5,357,899 A | | 10/1994 | Bassous et al. | | |
| 5,374,792 A | | 12/1994 | Ghezzo et al. | | |
| 5,398,011 A | | 3/1995 | Kimura et al. | | |
| 5,454,904 A | | 10/1995 | Ghezzo et al. | | |
| 5,462,839 A | | 10/1995 | de Rooij et al. | | |
| 5,479,042 A | | 12/1995 | James et al. | | |
| 5,496,668 A | | 3/1996 | Guckel et al. | | |
| 5,576,147 A | | 11/1996 | Guckel et al. | | |
| 5,627,396 A | | 5/1997 | James et al. | | |
| 5,641,400 A | | 6/1997 | Kaltenbach et al. | | |
| 5,742,012 A | | 4/1998 | Franzke et al. | | |
| 5,971,355 A | * | 10/1999 | Biegelsen et al. | ..... | 251/129.06 |
| 6,109,222 A | * | 8/2000 | Glezer et al. | ............. | 123/46 R |
| 6,210,514 B1 | * | 4/2001 | Cheung et al. | ............. | 156/241 |

FOREIGN PATENT DOCUMENTS

| | | | |
|---|---|---|---|
| EP | 0 685 864 A1 | | 6/1995 |
| EP | 0 757 431 A2 | | 2/1997 |
| EP | 0856 866 A1 | | 5/1998 |
| EP | 0845430 A2 | * | 6/1998 |
| EP | 0845603 A1 | * | 6/1998 |
| EP | 0845728 A2 | * | 6/1998 |
| EP | 0889 495 A1 | | 1/1999 |

OTHER PUBLICATIONS

Patent Abstracts of Japan, vol. 1998, No. 14, Dec. 12, 1998 & JP 10 255659 A (Omron Corp.), Sep. 25, 1998 Abstract.
Patent Abstracts of Japan, vol. 1996, No. 6, Jun. 28, 1996 & JP 08 036962 A (Matsushita Electric Works Ltd., Feb. 6, 1996 Abstract.

* cited by examiner

*Primary Examiner*—John J. Zimmerman
(74) *Attorney, Agent, or Firm*—Kirkpatrick & Lockhart LLP

(57) ABSTRACT

The present invention discloses a laminate-based electromechanical device and a method of fabricating laminate-based electromechanical devices. The device includes two or more layers of laminate bonded together to form a unitary laminate structure. The layers of laminate include a layer of organic dielectric material that may have at least a portion of one layer of electrically conductive material adherent thereto. The layers of organic dielectric material are bonded to form a unitary laminate structure through a process of lamination. The structures that make up the electromechanical device may be formed either before or after bonding. In particular, the various electromechanical structures that make up the electromechanical device are formed from the layers of organic dielectric material and the layers of electrically conductive material adherent thereto using a predetermined sequence of additive and subtractive fabrication techniques.

33 Claims, 9 Drawing Sheets

FIG.9
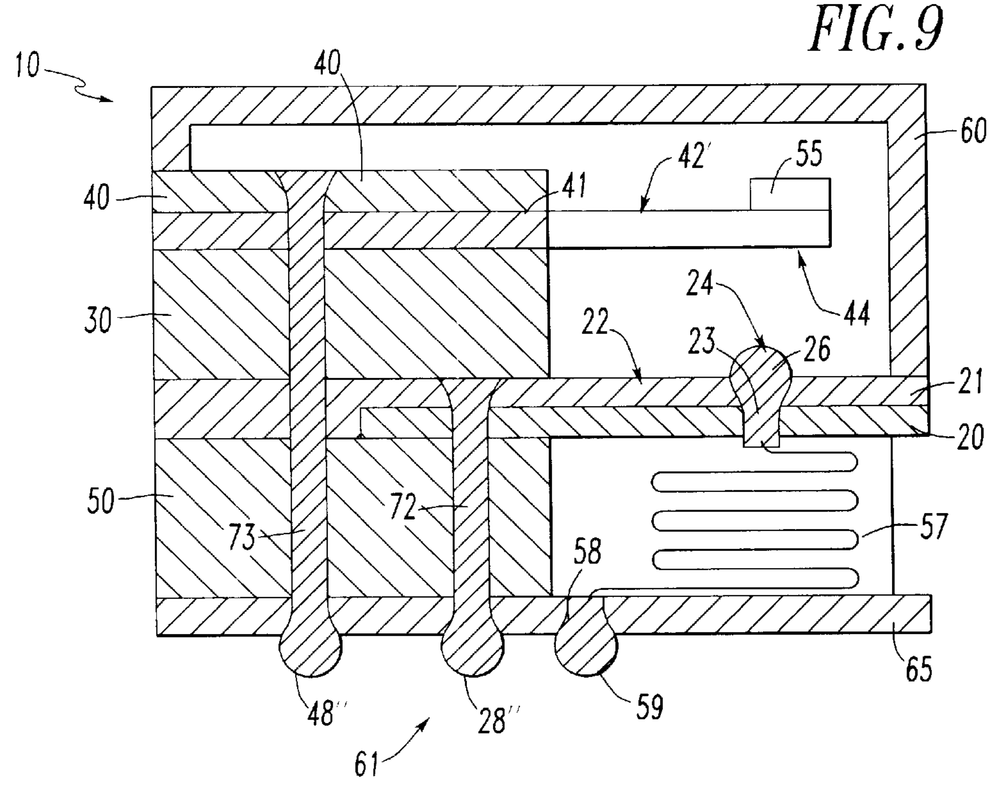
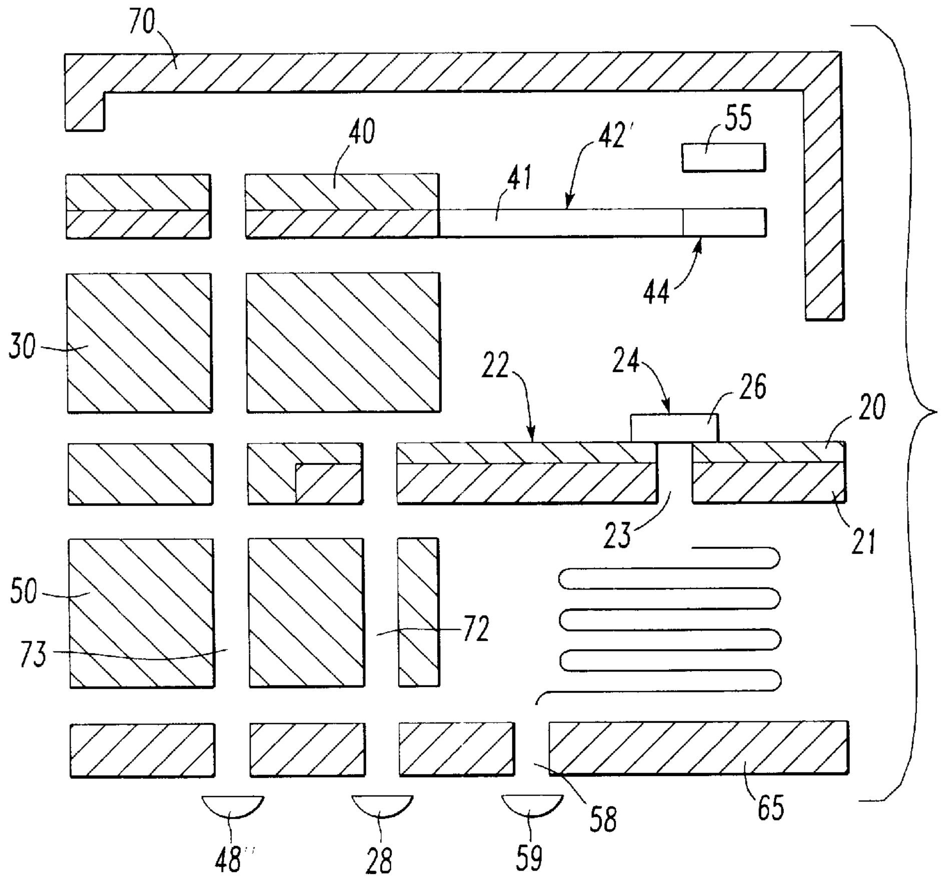
FIG.10

FIG. 13
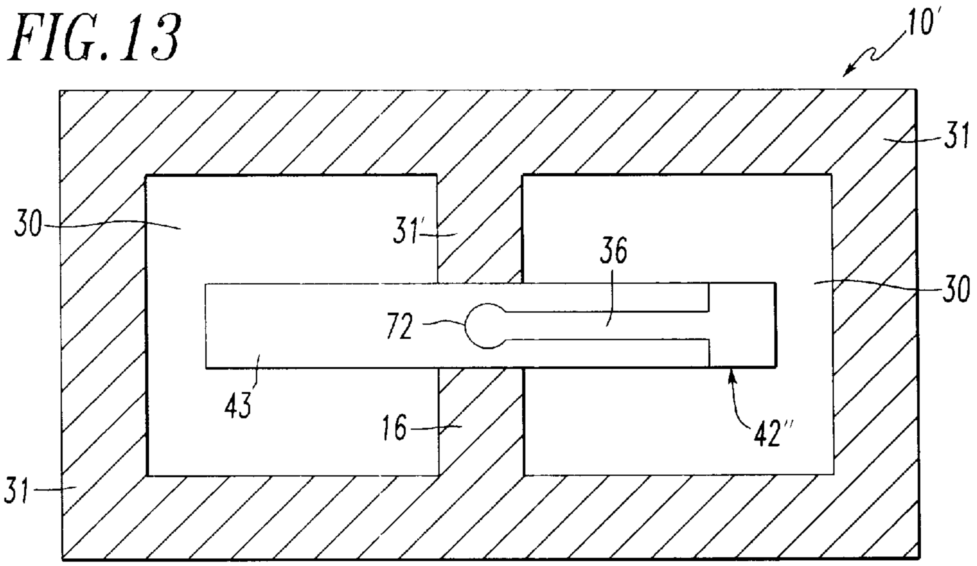
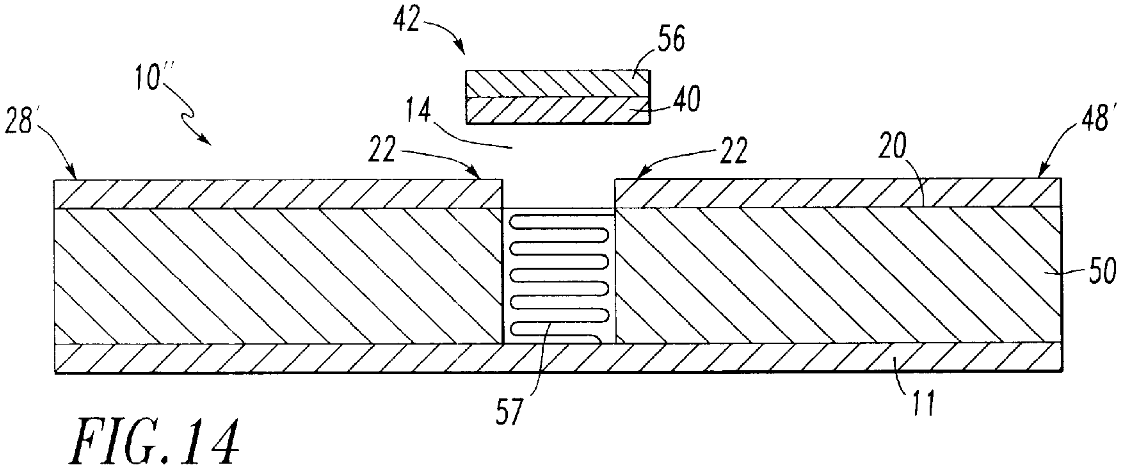
FIG. 14
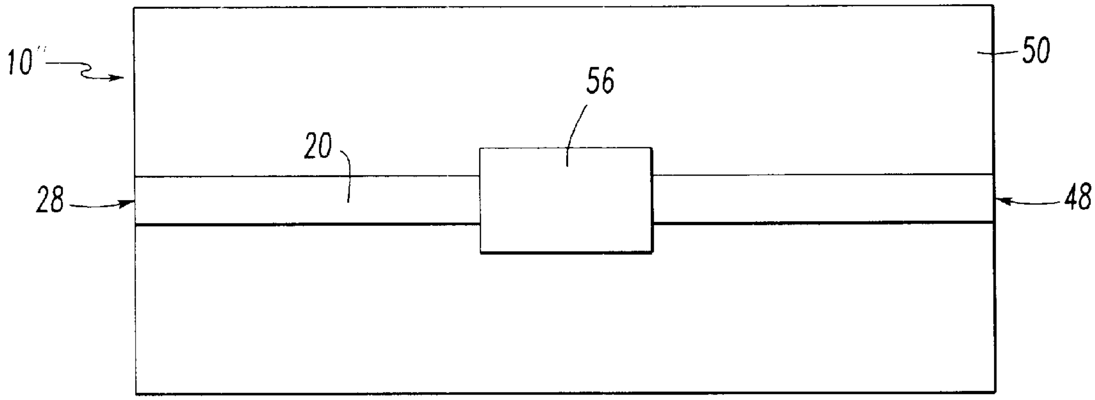
FIG. 15

LAMINATE-BASED APPARATUS AND METHOD OF FABRICATION

CROSS REFERENCE TO RELATED APPLICATIONS

Not Applicable

FEDERALLY SPONSORED RESEARCH

Not Applicable

TECHNICAL FIELD AND INDUSTRIAL APPLICABILITY OF THE INVENTION

The present invention relates to electromechanical devices having laminate structures and methods for fabricating such devices. More particularly, the present invention relates to laminate-based electromechanical relay devices and methods for fabricating such relays. However, the present laminate-based fabrication method may be suitably adapted for use in connection with the design and fabrication of a wide variety of laminate-based electromechanical devices. Accordingly, an example of a possible application of the laminate-based fabrication method and apparatus of the present invention includes the design and fabrication of high frequency range electromechanical relay devices.

DESCRIPTION OF THE INVENTION BACKGROUND

Conventional electromechanical devices, such as electromechanical relays, have traditionally been fabricated one individual device at a time, by either manual or automated processes. The individual devices produced by such an "assembly-line" type process generally have relatively complicated structures and exhibit high unit-to-unit variability. Such variability is undesirable because it limits the repeatability of performance from unit-to-unit. In particular, in the case of relays used to switch high frequency signals, such variances in physical geometry may result in changes in the device's inductance and capacitance, rendering such a device undesirable. While conventional electromechanical relays can be designed to reduce unit-to-unit variability, the resultant device is typically more costly to manufacture. Conventional electromechanical relays are also relatively large when compared to other electronic components. Size becomes an increasing concern as the packaging density of electronic devices continues to increase. Combined, these shortcomings render such conventional electromechanical relay devices undesirable.

A number of efforts at combating these and other shortcomings have focused on fabricating electromechanical devices, such as electromechanical relays, using silicon-based microfabrication techniques. Microfabrication, also known as micromachining, commonly refers to the use of known semiconductor processing techniques to fabricate devices known as microelectromechanical systems (MEMS) devices. Typical MEMS devices include motors, actuators and sensors. In general, known MEMS fabrication processes involve the sequential addition or removal of layers of material from a substrate layer through the use of thin film deposition and etching techniques until the desired structure has been achieved. Accordingly, MEMS devices typically function under the same principles as their macroscale counterparts. However, advantages in design, performance, and cost typically are also realized due to the great decrease in scale MEMS devices offer over their macroscale counterparts. In addition, due to the batch fabrication techniques employed to fabricate MEMS devices, significant reductions in unit-to-unit variation and per unit cost are also typically realized.

As noted above, MEMS fabrication techniques have been largely derived from the semiconductor industry. Accordingly, such techniques allow for the formation of a variety of micromechanical structures using adaptations of patterning, deposition, etching, and other processes that were originally developed for semiconductor fabrication. In general, these processes start with a wafer of silicon, glass, or other inorganic material. Multiple devices are then fabricated from the wafer through sequential addition and removal of layers of material using such techniques. Once complete, the wafer is sectioned (diced) to form the multiple individual MEMS devices (die). The individual devices are then fitted with external packaging to provide for electrical connection of the devices into larger systems and components. Again, the processes used for external packaging of the MEMS devices are analogous to those used in semiconductor manufacturing.

As an example, in the case of the moving contact of a MEMS relay, the moving contact may be formed using either surface micromachining techniques, bulk micromachining techniques, or a combination of the two techniques. In an example of surface micromachining techniques, an underlying layer, formed from an electrically conducting metal such as copper or gold, is defined, patterned, and deposited on the surface of a substrate typically formed from silicon, glass, or quartz. Through a photoresist process, a beam structure, typically formed from nickel or gold, is defined, patterned, and deposited on the surface of the underlying layer. The photoresist sheet is then removed, forming the actual structure of the beam. After the portion of the underlying layer that sits beneath the beam structure has been etched away, the resultant freestanding beam forms the moving contact of the relay. In an example of bulk micromachining, a free standing beam is formed from the layer of conducting material by deep etching of the underlying silicon, glass, or quartz substrate. The resulting beam structure is then plated with a layer of electrically conducting metal such as gold or copper. The resultant freestanding beam forms the moving contact of the relay.

MEMS devices have the desirable feature that multiple MEMS devices, or die, may be produced simultaneously in a single batch by processing many individual components on a single wafer. For example, using either surface or bulk micromachining, numerous individual relay devices may be formed on a single wafer of silicon. Once fabrication is complete, the substrate is typically diced to produce individual die. Each die typically contains a single relay. The individual relays may then be packaged in the same manner as semiconductor, for example, on a lead frame or chip carrier. Accordingly, the ability to produce numerous devices in a single batch results in a cost savings over the "one out" or "assembly line" style typically used by macro scale production techniques. The use of batch processing also increases the throughput of the MEMS fabrication process, while decreasing the overall variation between the individual die fabricated in each batch. In the specific example of electromechanical relays fabricated using MEMS fabrication techniques, batch processing has the advantage of increasing the uniformity of MEMS relay devices, decreasing the size of the devices, and reducing the cost associated with the fabrication and processing of the devices.

However, MEMS fabrication techniques are not without their drawbacks. In the example of electromechanical relays, the physical properties of the silicon, quartz, and glass substrates on which the MEMS relay devices are typically fabricated are not well suited in general to the demands placed on them by the design of an electromechanical relay. In particular, it is important to the operation of an electromechanical relay that the contacts on the relay be fully isolated when the relay is in the open position, such that no signal is carried across the relay, and that there be no isolation or resistance between the contacts when the relay is in the closed position, such that the signal is carried undistorted across the relay. Due to the reduced scale of MEMS devices, and the materials and processes used in MEMS fabrication, MEMS devices do not easily lend themselves to vertical processing. Accordingly, the physical spacing, and thus the signal isolation, between the contacts in a MEMS relay is often insufficient to fully isolate the contacts when the relay is in the open position. Thus, MEMS relays often exhibit an unacceptable flow of current across the contacts when the relays are in the open position. This problem is particularly apparent when the relays are used to switch high frequency signals. The ability of MEMS relays to operate at high frequencies may also be reduced by the dielectric properties of the material employed to fabricate the MEMS relay. Silicon, for example, has a relatively high microwave loss tangent, thereby limiting the performance at high frequencies of devices formed from silicon.

Further, particularly in many high frequency applications, it is desired that a relay behave as a controlled impedance structure. In particular, when relays, or other electromechanical devices, are intended for operation at very high frequencies, the electrical parameters of the structures from which the relay is constructed (e.g. resistance, inductance, and capacitance) will affect the overall frequency response of the relay. For a given frequency, or over a given range of frequencies, the impedance of a relay is determined by these electrical parameters. Thus, given the variations in material and construction between the electromechanical structures from which a relay is constructed (e.g. input connections, moving contact, stationary contact, output connections, etc.), each of the structures from which the relay is constructed may exhibit a different impedance. Such variations in impedance at the transition points between the various structures of the relay (typically called "mismatches") can adversely affect performance of the relay at certain frequencies. For example, over a given range of frequencies, a mismatch may cause the signal carried by the relay to become attenuated and/or the waveform of the signal to become distorted, thus rendering the relay unsuitable for certain applications.

In traditional macroscale relay devices, such mismatches are avoided by choosing the materials from which the relay is constructed so as to minimize the variations in impedance throughout the various structures of the relay for the range of frequencies at which the relay is to be operated. For example, the input and output connections may be formed as a transmission line structure in which the impedance of the signal conductor is referenced to the impedance of the ground conductor. Examples of common transmission line structures include: (a) Coaxial, in which the signal conductor is the center conductor, and the ground an outer shield and the center conductor is separated from the shield by dielectric material; (b) Microstrip, in which the signal is carried on a rectangular cross-section conductor separated from a ground plane layer by dielectric material; (c) Stripline, in which the signal conductor is sandwiched between two ground planes (with dielectric separation); and (d) Co-planar waveguide, in which the signal conductor and two parallel adjacent ground conductors are patterned on the same dielectric substrate. The ideal transmission line has a characteristic impedance that is independent of the location along the transmission line. As such, a macroscale relay device that is to be operated over a range of high frequencies will ideally be designed to exhibit a specific impedance over the range of frequencies of operation throughout its entire transmission line. Such a transmission line structure is commonly referred to as a controlled impedance structure.

However, MEMS devices may be fabricated on only a limited number of substrate materials. As previously noted, such materials often exhibit unacceptable performance characteristics when used in devices designed to function at high frequencies. Thus, such devices often require additional or secondary packaging to overcome these shortcomings in performance. The need for secondary packaging represents a significant disadvantage to the use of MEMS fabrication techniques in relay applications. In particular, after MEMS relay devices have been processed, the individual die are typically each transferred to a separate substrate or lead frame. The lead frame provides for the electrical connection of the relay to other devices by, for example, a ball grid array or a pin grid array. This secondary packaging step is highly undesirable due to the additional cost of the lead frame and packaging step, such cost will often exceed the cost of the relay itself. In addition, the potential yield loss in the resulting packaged device and the potential performance limitations that may result in the packaged device due to the creation of impedance mismatches between the device and the package are also quite undesirable.

The present invention is thus directed to a method of fabricating electromechanical devices such as relays, which addresses, among others, the above-discussed needs and provides a low cost electromechanical device that exhibits consistent and superior performance and operation at increased frequency ranges when compared with currently available devices.

SUMMARY OF THE INVENTION

In accordance with the present invention, there is provided a method of fabricating laminate-based electromechanical devices and the laminate-based electromechanical devices resulting therefrom. Unlike the known methods of fabrication of MEMS devices, the laminate-based fabrication method of the present invention includes fabricating component electromechanical structures of an electromechanical device from individual layers of laminate material using, for example, materials and processes from the art of semiconductor and printed circuit board manufacturing, followed by the joining of the individual layers of laminate material to form a unitary laminate electromechanical device. Additionally, the present invention is directed to a method that includes joining individual layers of laminate material to form a unitary laminate structure, followed by the fabricating of an electromechanical device from the unitary laminate structure using, for example, processes from the art of semiconductor and printed circuit board manufacturing. The present invention is further directed to a method of fabrication that employs various combinations of fabricating the component electromechanical structures of an electromechanical device from individual layers of laminate material using, for example, materials and processes from the art of printed circuit board manufacturing, and combining the individual layers of laminate material to form a unitary laminate electromechanical device. When applied to the fabrication of electromechanical relays, the present invention thus allows for greater optimization of the materials used in the fabrication of the device so as to allow the device to perform as a controlled impedance structure over a range of high frequencies. The present laminate construction technique also results in an electromechanical device that includes integral packaging and thus does not require secondary packaging operations.

In the case of a laminate-based electromechanical relay device fabricated using the method of the present invention, an embodiment of that method involves the fabrication and sequential lamination of component electromechanical structures, including, for example, conductors, contacts, and actuators, formed from individual layers of dielectric materials, to form a unitary three-dimensional laminate structure. In particular, actuators, leads, connectors, conductors, contacts, and other electromechanical structures of the relay may be defined by subtractive processes known in the art of semiconductor and printed circuit board fabrication, such as, for example, photodefinition and etching of an electrically conducting material clad on a layer of laminate material. Alternatively, such electromechanical structures may be formed by additive processes known in the art of semiconductor and printed circuit board fabrication, such as, for example, de position of an electrically conducting layer on a layer of laminate material. Further fabrication processes known in the art of semiconductor and printed circuit board fabrication, including, for example, laser ablation or drilling, may also be employed to create such electromechanical structures.

The present laminate based fabrication method thus represents an improvement upon existing fabrication methods by permitting for the use of a wider range of materials and thereby increasing the range of materials that may be used to optimize the performance and current carrying capacity of the device for use in high frequency applications.

The present laminate-based fabrication method represents a further improvement upon existing fabrication methods by increasing the ability to use vertical processing to fabricate laminate based electromechanical devices having layers of increased thicknesses, and thereby increasing the physical separation and electrical isolation between layers.

The present laminate-based fabrication method represents yet another improvement over existing fabrication methods by providing the ability to fabricate electromechanical devices having electrical contact surfaces of increased size and, therefore, increased current carrying capacity.

The present invention provides still another advantage over existing fabrication methods by allowing for fabrication of laminate-based electromechanical devices of a variety of transmission line structures that incorporate integral packaging of input/output connectors within the electromechanical device itself, thus eliminating the need for secondary packaging of the relay with input/output connectors.

The present invention represents another advantage in that it may also be utilized to imbed electromechanical devices directly into larger multi functional circuits and components during the fabrication process, thereby eliminating the need for ancillary processing and assembly. As such, the laminate-based electromechanical device fabricated of the present invention is self-packaging.

The present laminate based fabrication method provides a further advantage by allowing for the batch fabrication of multiple individual laminate-based electromechanical devices, of either identical or differing design, on a single laminated panel. The present invention additionally provides for the batch fabrication of multiple devices as part of a single component that contains various other laminate-based electromechanical devices that may be either electrically linked or unlinked.

The present invention also provides for the concurrent batch fabrication of multiple electromechanical devices electrically linked together in various arrangements to form a single component, such as a switch matrix. Thus, the present laminate-based construction method readily provides for three-dimensional interconnection of electromechanical devices.

The present invention thus provides another advantage because the surface area of the wafer on which the devices are fabricated need not be devoted to use by electrical interconnections. Thus, laminate structures, in which certain layers of the structure are dedicated to, for example, interconnection of the devices in the adjacent layers, are possible and the surface area of the wafer that may be occupied by the devices themselves is increased.

The present laminate-based fabrication method provides yet another additional advantage over existing MEMS fabrication methods by providing for the simultaneous fabrication of a relatively greater number of individual electromechanical devices in a single batch. Such advantage arises due to the increased available surface area of a typical printed circuit board panel relative to a typical substrate wafer used by other fabrication methods, where the size of a panel may be an order of magnitude greater than the other substrate. Thus, because a greater number of relays can be fabricated simultaneously on a single panel, the present laminate-based device provides economic advantages with respect to its existing counterparts by offering a reduced per unit cost.

Still additional economic advantages result from the present invention due to the relatively low costs associated with printed circuit board processing techniques as compared with other processing techniques. The laminate-based relay device thus achieves the advantages of mass production offered by existing fabrication methods, while providing additional versatility and potential economies.

Accordingly, the present invention provides for an improved method of fabricating electromechanical devices and results in laminate-based electromechanical device having improved function in, for example, high-frequency relay applications. In particular, the present invention provides for a method of fabricating a laminate-based relay device resulting in a laminate-based relay device capable of improved operation at high frequencies. The reader will appreciate these and other details, objects, and advantages of the present invention upon consideration of the following detailed description of embodiments of the invention, and may also comprehend such details, objects, and advantages of the invention upon practicing the invention.

BRIEF DESCRIPTION OF THE DRAWINGS

In the accompanying drawings, embodiments of the present invention are shown, wherein like reference numerals are employed to designate like elements and wherein:

FIG. 9 is a partial cross-sectional side view of another embodiment of the present invention that comprises a single-pole single-throw relay device fabricated using a method of the present invention, and having ball-grid array input/output connections and a cover, shown in the open position;

FIG. 10 is a side assembly partial cross-sectional view of the relay device shown in FIG. 9;

FIG. 13 is a partial cross-sectional top view of the relay device shown in FIG. 11;

FIG. 14 is a cross-sectional side view of another embodiment of the present invention that comprises a single-pole single throw strip-line relay device fabricated using a method of the present invention;

FIG. 15 is a top view of the relay device shown in FIG. 14;

DESCRIPTION OF EMBODIMENTS OF THE INVENTION

Figure 1:
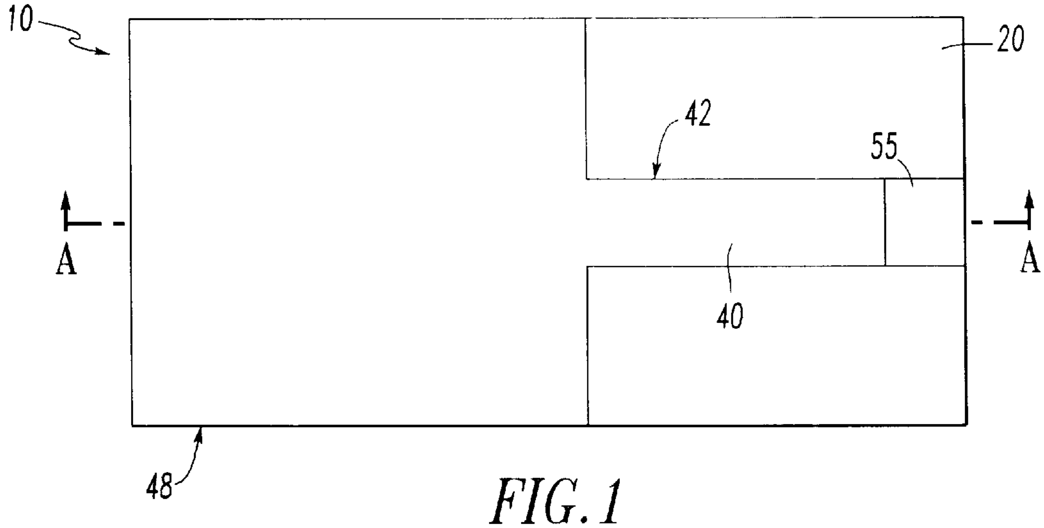
FIG. 1 is a top view of an embodiment of the present invention comprising a single-pole single-throw relay device fabricated using a method of the present invention provided with input/output connections.

Referring now to the drawings for the purposes of illustrating embodiments of the invention only, and not for purposes of limiting the same, the Figures show various laminate-based electromechanical relay devices, fabricated according to the method of present invention from layers of dielectric material laminated together to form a unitary three-dimensional electromechanical structure. While the present laminate based. fabrication method may, for example, permit the straight forward fabrication of electromechanical relay devices that are optimized to function as controlled impedance structures at microwave frequencies, such as, those shown herein in the Figures, one of average and ordinary skill in the art will appreciate that the present invention may be successfully employed to fabricate myriad of other electromechanical devices. Therefore, it will further be appreciated that the laminate-based electromechanical relay devices referred to herein in the Figures and in the following description are intended only to illustrate and exemplify certain embodiments of the present invention and the variety of laminate-based electromechanical devices that may be fabricated utilizing the present invention. Accordingly, the protection afforded to the embodiments of the present invention discussed and claimed herein should not be limited solely to use in connection with the laminate-based electromechanical relay devices depicted in the Figures. Instead, it will be understood that the present invention may also be utilized in connection with various other electromechanical devices including, but not limited to, valves, actuators, sensors, and motors. In addition, after reviewing the present specification and drawings, it will be understood by one of ordinary skill in the art that the laminate-based electromechanical relay devices depicted herein may be fabricated using certain processes also applied in the art of semiconductor and printed circuit board manufacturing. However, one of ordinary skill in the art will further understand that the fabrication of the various other of the laminate-based electromechanical devices that are possible under the method disclosed herein could implicate use of fabrication processes utilized in semiconductor and printed circuit board manufacturing.

With reference now to the Figures, the structure of the laminate-based electromechanical relay device, used herein to help describe the present invention, includes a relay 10 having a single-pole single-throw (SPST) contact configuration. As shown in particular in FIGS. 1–3, the relay 10 generally includes first layer 20, and second layer 40, first intermediate layer 30, second intermediate layer 50, actuating mechanism 51, input and output connections 28 and 48, respectively, and ground plane 65.

The first layer 20, is typically fabricated from a panel of organic dielectric material. For example, the first layer 20 may be fabricated from material used in printed circuit board manufacturing, such as epoxy, polyimide, epoxy-glass laminates, polytetrafluoroethylene (PTFE), cyanate ester, liquid crystal polymer (LCP), or the like. However, it will be understood that the identity of the organic dielectric material will vary depending upon the particular operational needs required of the relay 10, such as strength, overall performance, flexibility, and industry mandated standards. The first layer 20 generally includes a stationary contact 22 formed therefrom. In particular, the first layer 20 is typically clad on at least one side with a layer of electrically conductive material 21, such as, for example, copper, silver, nickel, gold, or an alloy thereof, and the stationary contact 22 patterned and etched directly therefrom. The stationary contact 22 generally includes a stationary contact area 24. The stationary contact area 24 is located at one end of stationary contact 22 and is adapted to contact a moving contact area 44, described below. The stationary contact area 24 may be provided with a stationary contact area overlay 26 positioned thereon. The stationary contact area overlay 26 generally includes an additional overlay of material, positioned within the stationary contact area 24. The stationary contact area overlay 26 is adapted to reduce the electrical resistance between the stationary contact 22 and the moving contact 42 when the device 10 is in the closed position, as shown, in particular, in FIG. 2 and as detailed further below. The stationary contact area overlay 26 may be fabricated from, for example, a plating of gold, gold alloy, silver, silver alloy, ruthenium, rhodium, or other similarly suitable electrically conducting material. However, it will be appreciated that the precise identity of the material used in the stationary contact area overlay 26 will vary depending upon the particular operational needs required of the relay 10, such as current handling capacity, frequency response, or contact resistance.

The second layer 40 is typically fabricated from a panel of printed circuit board material, such as that detailed above with respect to first layer 20. The second layer 40 generally includes a moving contact 42 formed therefrom. In particular, the second layer 40 is typically clad on at least one side with a layer of electrically conductive material 41, such as that detailed above with respect to the layer of electrically conductive material 21, and the moving contact 42 patterned and etched directly therefrom. The moving contact 42 generally includes a moving contact area 44 at one end thereof. The moving contact area 44 is located at one end of moving contact 42 and is adapted to selectively contact the stationary contact area 24. The moving contact area 24 may be provided with a moving contact area overlay 46 positioned thereon. The moving contact area overlay 46 generally includes an additional overlay of material positioned within the moving contact area 44. The moving contact area overlay 46 operates in a similar fashion as that of the stationary contact area overlay 26, to reduce the electrical resistance between the moving contact 42 and the stationary contact 22 when the device is in the closed position. See FIG. 2. The moving contact area overlay 46 may be formed from the same materials as detailed above with regard to stationary contact area overlay 26. It will thus be understood by one of ordinary skill in the art that stationary and moving contact area overlays 26 and 46, respectively, are positioned on the stationary and moving contacts 22 and 42, respectively, to coincide and contact each other when the device is in the closed position (see FIG. 2).

Figure 4:
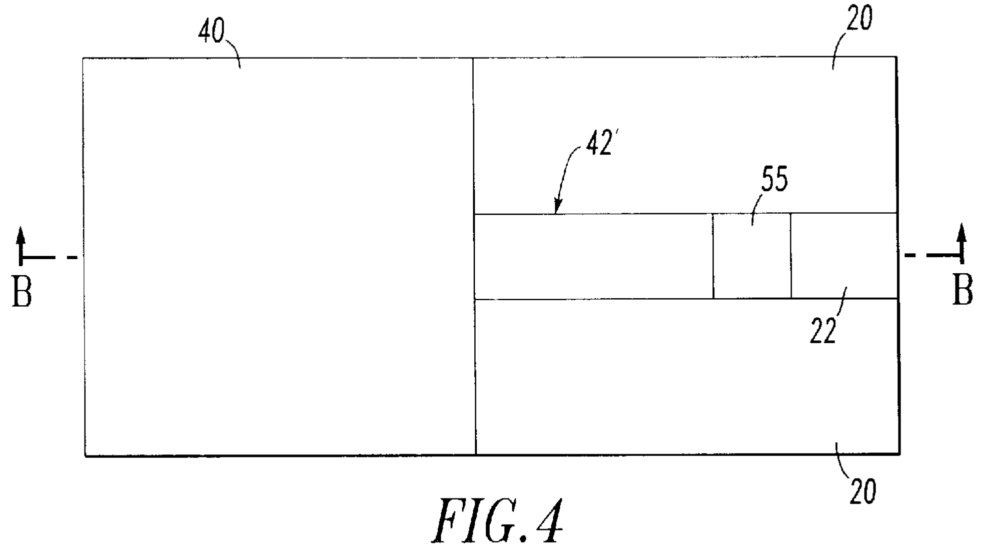
FIG. 4 is a top view of another embodiment of the present invention comprising a single-pole single-throw relay device fabricated using a method of the present invention, having opposing input/output connections and a cover.

It will be appreciated that the moving contact 42 may take various alternate embodiments in addition to that described above. For example, moving contact 42 may be formed only from a layer of electrically conducting material having no underlying layer of dielectric material. Such alternative construction for the moving contact 42 is shown in FIGS. 4–6, wherein the moving contact is identified as 42' and includes a layer of electrically conductive material 41 having no underlying second layer 40 of dielectric material.

Figure 2:
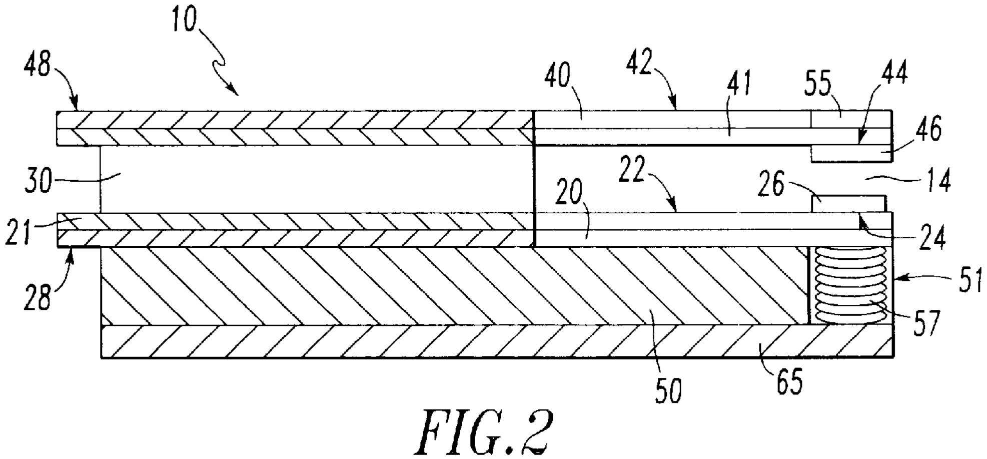
FIG. 2 is a partial cross-sectional side view, taken along the line A—A in FIG. 1, of the relay device shown in FIG. 1, shown in an open position.
Figure 3:
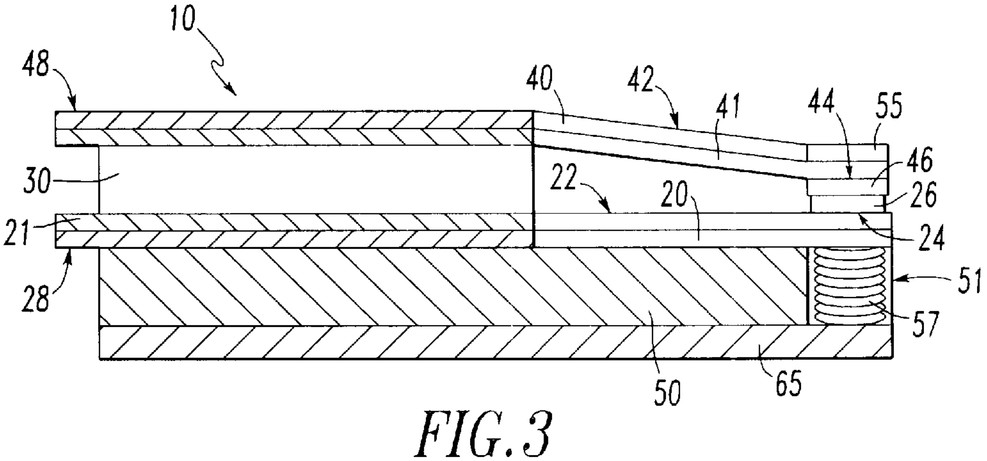
FIG. 3 is another partial cross-sectional side view taken along the line A—A in FIG. 1, of the relay device shown in FIG. 1, and shown in a closed position.
Figure 5:
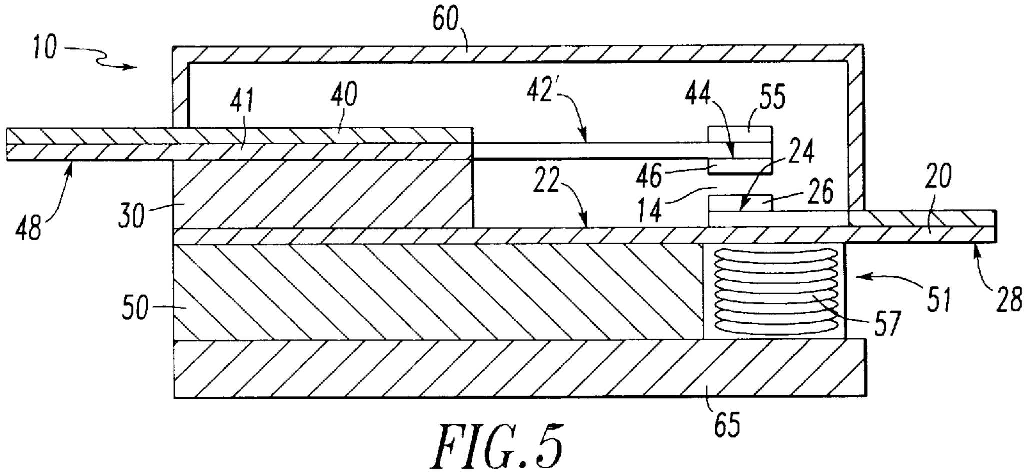
FIG. 5 is a cross-sectional side view, taken along the line B—B in FIG. 4, of the relay device shown in FIG. 4.
Figure 6:
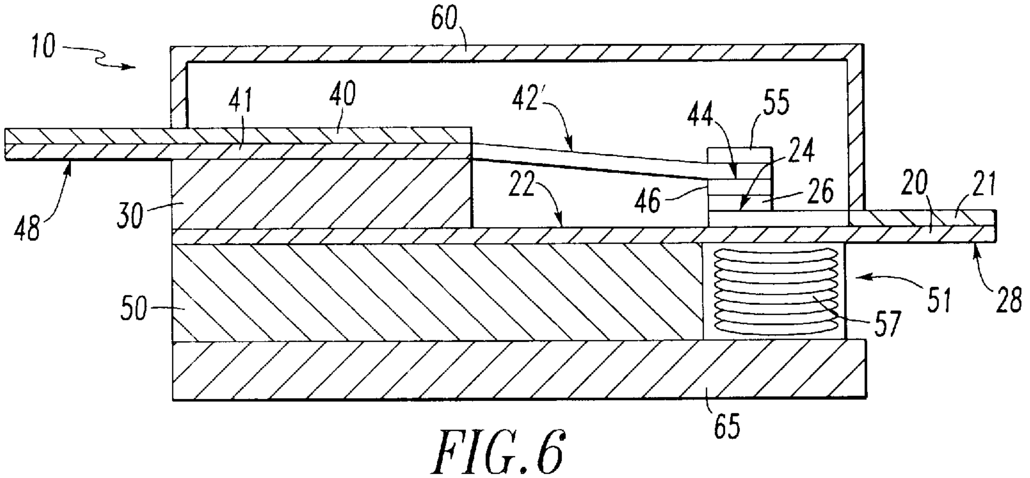
FIG. 6 is a partial cross-sectional side view, taken along the line B—B in FIG. 4, of the relay device shown in FIG. 4, and shown in a closed position.

In both embodiments of the moving contact (42, 42'), the electrically conducting material used to construct the electrically conducting layer 41 of the moving contact (42, 42') may be formed from copper or a similarly suitable metallic electrically conducting material having mechanical properties that permit the moving contact (42, 42') formed therefrom to be able to deflect and make electrical contact with the stationary contact 22 (see FIGS. 2 and 5). For example, a metallic alloy, such as beryllium-copper provides the superior elastic properties required of the moving contact (42, 42'). Thus metallic alloys are materials from which the moving contact (42, 42') may be fabricated.

The first and second layers 20 and 40, respectively, are typically separated by first intermediate layer 30. The first intermediate layer 30 may be formed from the same dielectric material as is detailed above with regard to the first and second layers 20 and 40, respectively. It will be appreciated that the first intermediate layer 30 may alternatively include multiple individual layers of dielectric material (not shown). In addition, the first intermediate layer 30 may be formed, at least in part, from an area of the first or second layers 20 and 40, respectively, having increased depth. In any of these embodiments, the first intermediate layer 30 is adapted to physically separate first layer 20 from second layer 40 create an air gap 14 between stationary contact 22 and moving contact (42, 42'). Air gap 14 may be achieved by, for example, ablation of that portion of the intermediate layer 30 that lies between stationary contact 22 and moving contact (42, 42'). The air gap 14 is provided between the stationary contact 22 and the moving contact (42, 42') to allow moving contact (42, 42') to move between an open position (see FIGS. 1 and 4) and a closed position (see FIGS. 2 and 5). In addition, air gap 14 has the effect of electrically insulating moving contact (42, 42') from stationary contact 22 when the relay 10 is in the open position (see FIGS. 1 and 4) such that substantially no current may pass through the relay 10. However, it will be understood that, when the relay 10 is in the closed position (see FIGS. 2 and 5), current is permitted to pass across the relay 10. It will thus further be appreciated by one of average and ordinary skill in the art that by increasing or decreasing the overall thickness of intermediate layer 30, the electrical insulating effect of the air gap 14 may be varied to allow the relay 10 to meet various insulating and current carrying requirements.

The first layer 20 is typically provided atop a second intermediate layer 50. The second intermediate layer 50 may be formed form the same dielectric material as is detailed above with regard to first and second layers 20 and 40, respectively. It will be appreciated that the second intermediate layer 50 may alternatively be formed from multiple individual layers of dielectric material (not shown), as described above with regard to the first intermediate layer 30. In addition, it will be appreciated that the second intermediate layer 50 may be formed, at least in part, from an area of the first layer 20 having increased depth. A ground plane 65, formed from an non-electrically conducting material may be formed on the underside of second intermediate layer 50, opposite first layer 20. The ground plane 65 acts to electrically insulate and ground the relay 10 during operation.

An actuating mechanism 51 is typically formed within second intermediate layer 50. The actuating mechanism 51 generally provides a means for reciprocal deflection of moving contact (42, 42') between the open position (see FIGS. 1 and 4) and the closed position (see FIGS. 2 and 5). In the embodiments depicted herein in the figures, the actuating mechanism 51 includes an electromechanical actuating device. An electromagnetic actuation device provides advantages over other means of actuation because it provides an actuating force consistent with a low contact resistance and an operating voltage compatible with digital logic circuits. However, one of average and ordinary skill in the art will appreciate that, in addition to the electromagnetic actuation mechanisms detailed herein, alternate types of actuating mechanisms (not shown) are possible with the present invention. Such alternate methods of actuation are generally known in the art and include, for example, electrostatic, piezoelectric, or phase change, shape memory, thermomechanical, magnetorestrictive, and electroheological actuators.

The actuating mechanism 51 depicted in the Figures generally includes a magnetic material 55 and an electrically conducting coil 57. The magnetic material 55 of the actuating mechanism 51 is positioned at the tip of the moving contact (42, 42') adjacent to and above moving contact area 44, from a layer of magnetic material clad on second layer 40. The electrically conducting coil 57 is positioned within second intermediate layer 50, immediately beneath stationary contact area 24. The electrically conducting coil 57 is fabricated from a coil-shaped piece of metallic material formed within the second intermediate layer 50 by one of a variety of fabrication processes known in the art. In an alternative, the electrically conducting coil 57 may be fabricated from, for example, planar conductors (not shown) formed within the second intermediate layer 50 by one or a combination of fabrication processes as are known in the art. In addition, it will be appreciated that, although in the accompanying Figures the electrically conducting coil 57 is shown to be integral with intermediate layer 50, in alternate embodiments, the electrically conducting coil 57 may also be formed in other arrangements, for example, external to second intermediate layer 50.

As described above, the second layer 40 is formed as a cantilever beam structure having sufficient strength and structure to support the moving contact 42 in the open position (See FIGS. 1 and 2). In an alternative embodiment, also described above, the layer 41 alone is of sufficient strength and dimension to independently support the moving contact 42' in the open position (See FIGS. 4 and 5). Accordingly, in operation, when a current is passed through the electrically conducting coil 57, an electromagnetic field (not shown) is generated. The electromagnetic field acts on the metallic elements of the moving contact (42, 42') and magnetic material 55 with sufficient force to overcome the inherent bending strength of the second layer 40 and to urge the moving contact (42, 42') in the direction of the electrically conducting coil 57. The relay is thereby brought into the closed position (see FIGS. 2 and 5). When the current to the electrically conducting coil 57 is discontinued, the electromagnetic field is dissipated, and the second layer 40 reflexively returns the moving contact (42, 42') and the relay to the open position (See FIGS. 1 and 4).

It will further be appreciated by one of ordinary skill in the art that, in alternative. embodiments, shown in FIGS. 17–22, the second layer 40 and the layer 41 of electrically conducting material may not have sufficient strength and structure to maintain the moving contact (42, 42') in the open position. In such an embodiment, the moving contact (42, 42') may be maintained in the open position by a permanent magnet 56. The permanent magnet 56 is adapted to provide a restoring magnetic force to aide in maintaining moving contact (42, 42') in the open position. Permanent magnet 56 is supported by additional layers 53 and 54 of dielectric substrate positioned atop second layer 40. Additional layers 53 and 54 dielectric material form a cantilever beam structure of sufficient strength and dimension to support the permanent magnet 56 in a position adjacent to and above magnetic material 55. In operation, the magnetic field (not shown) created by the permanent magnet 56 is sufficient to act on the metallic elements of moving contact (42, 42') and magnetic material 55 to maintain the moving contact (42, 42') in the open position (see FIGS. 17 and 20). As with the embodiments previously discussed herein, when current is passed through electrically conducting coil 57, the coil 57 acts to create an electromagnetic field (not shown). This field is capable of overcoming the restoring force of the magnetic field created by the permanent magnet 56 and urging the moving contact (42, 42') into the closed position (See FIGS. 19 and 22). When the current to the electrically conducting coil 57 is discontinued, the electromagnetic field created thereby is dissipated, and the magnetic field generated by the permanent magnet 56 is again sufficient to aide in restoring the moving contact (42, 42') to the open position (See FIGS. 17 and 20).

Electrical connections 28 and 48 for stationary contact 22 and moving contact (42, 42'), respectively, are typically provided to enable the relay 10 to be electrically connected to other devices. As shown in particular in FIGS. 1, 2, 17, and 18, the electrical connections 28 and 48, may be formed from the portions of layers 21 and 41, respectively, that extend away from the contact areas 24 and 44 respectively. In particular, second layer 40 and the layer 41 of electrically conducting material extend beyond the periphery of relay 10 to form electrical connection 48. Similarly, first layer 20, and the layer 21 of electrically conducting material, extend beyond the periphery of relay 10 to form electrical connection 28. In an alternative embodiment, it will be appreciated that only layers 21 and 41 of electrically conducting material are extended beyond the periphery of relay 10 to form electrical connections 28 and 48, respectively. However, it will further be appreciated that, in any of the disclosed embodiments, the electrical connections 28 and 48 are adapted to permit the relay 10 to be electrically connected to various other electrical devices and components, such as, for example, a printed circuit board (not shown) or other substrate (not shown) for use as part of a larger electromechanical device, without the need for secondary packaging.

In addition, it will be appreciated that the embodiments described above may be formed with a cover layer 60, as shown in FIGS. 4–6, and 20–22. In particular, the cover layer 60 may be formed from the same dielectric material described above with regard to first and second layers 20 and 40, respectively. The cover layer 60 thereby acts to shield the various electromechanical components of the relay 10 from various elements of the environment in which it is used.

Figure 7:
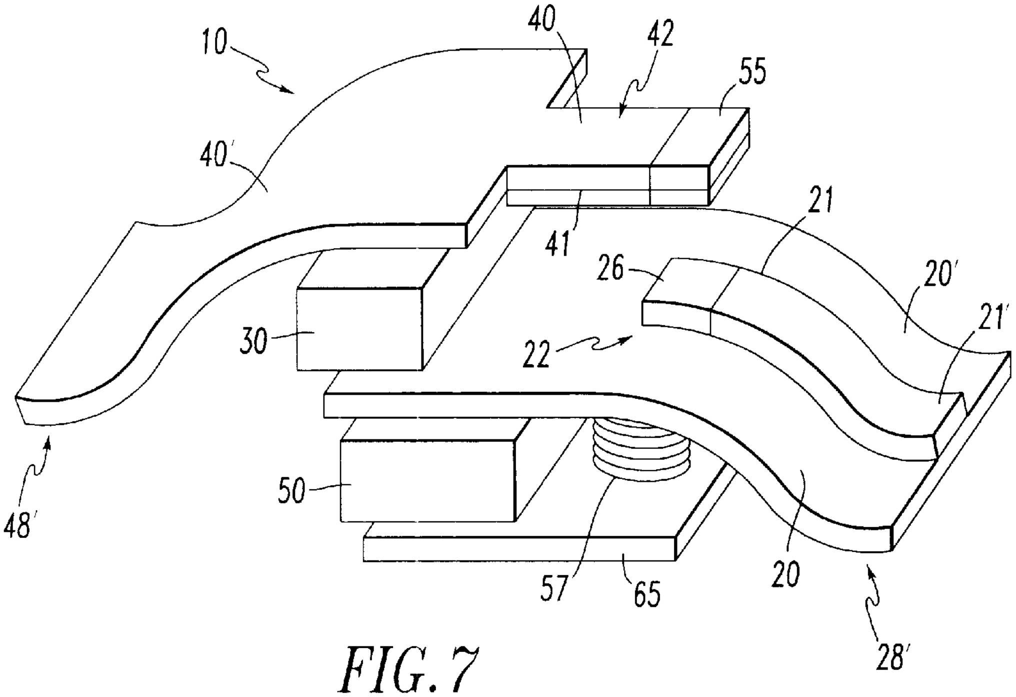
FIG. 7 is an assembly view, shown in perspective, of another embodiment of the present invention that comprises a single-pole single-throw relay device fabricated using a method of the present invention, and having flexible input/output connections, shown in the open position.
Figure 8:
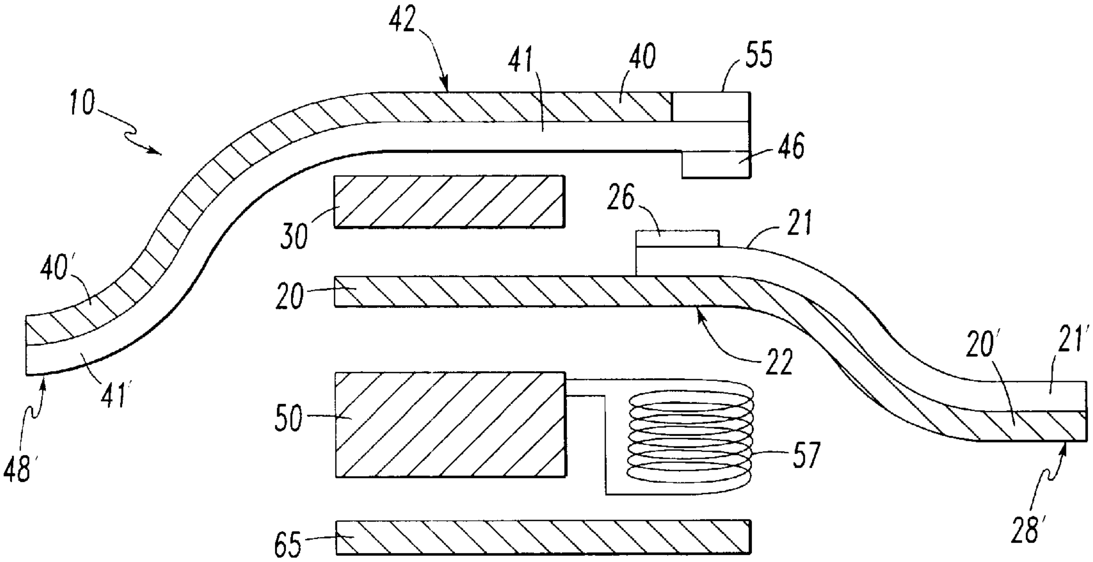
FIG. 8 is a side assembly partial cross-sectional view of the relay device shown in FIG. 7.

Having now been apprised of the present invention, as embodied in the SPST relay 10 described above, and depicted in the Figures, those of average and ordinary skill in the art will appreciate that various other laminate-based electromechanical devices are possible with the present invention. In particular, various other laminate-based relay devices, having various other input/output configurations, will be apparent. In one such construction, shown in FIGS. 7 and 8, input/output connections 28' and 48' of stationary and moving contacts 22 and 42, respectively, of an SPST relay device are formed from a material that has flexible properties, such as, for example, polymide-based organic dielectric material. The flexible input/output connection 28' may include integral flexible extensions 20' and 21' of dielectric material layer 20 and electrically conductive layer 21, respectively. Similarly, a flexible input/output connection 48' may include integral flexible extensions 40' and 41' of dielectric material layer 40 and electrically conductive layer 41, respectively. Accordingly, integral flexible extensions 20' and 21', of dielectric and conductive second layers 20 and 21, respectively, extend beyond the periphery of relay 10 to form flexible input/output connection 28'. Similarly, integral flexible extensions 40' and 41', of dielectric and conductive layers of 40 and 41, respectively, extend beyond the periphery of relay structure 10 to form flexible input/output connection 48'. Such orientations of the connections 28' and 48' beyond the relative periphery of relay structure 10 can be best appreciated from reference to FIG. 8. A relay 10 having such flexible input/output connections 28' and 48' may thereby be electrically connected to, for example, a printed circuit board or other structure in a variety of configurations as are known in the art without the need for secondary packaging.

In another alternate construction, shown in particular in FIGS. 9 and 10, the electrical connections 28" and 48" of stationary and moving contacts 22 and 42', respectively, of an SPST relay device having a cover 60 are formed in a ball-grid array. In particular, the electrical connections 28" and 48" may include ball-shaped electrical connections formed from electrically conductive material that are electrically connected to stationary and moving contacts 22 and 42', respectively, by way of plated through holes 72 and 73, respectively. The ball-shaped electrical connections are thereby suitable for electrically connecting the relay device 10 to other devices. Plated through holes 72 and 73 may be accomplished by forming a hole in the various layers by, for example, a process of mechanical or laser drilling, and filling or plating the holes with an electrically conductive material, such as, for example, one of the electrically conducting materials mentioned above with regard to the fabrication of stationary contact 22. The electrical connections 28" and 48" are formed at the open end of the plated through holes 72 and 73, respectively, as ball connectors. The material used for electrical connections 28" and 48" may include an electrically conducting material, such as, for example, one of the materials mentioned above with regard to the construction of stationary contact 22.

As shown, in FIGS. 9 and 10, plated through hole 73 extends from second dielectric material layer 41, through a second electrically conductive layer 40, and intermediate layers 30 and 50, to form an opening in ground plane 65. The ball connection 48" is thus formed at the opening of plated through hole 73 along the surface of ground plane 65. Plated through hole 72 is formed from a bore that extends from first dielectric material layer 21, through first electrically conductive layer 20 and intermediate layer 50, to form an opening in the ground plane 65. The ball connection 28" is thus formed at the opening of plated through hole 72 along the surface of ground plane 65. The stationary contact 22 and the moving contact 42' of the relay 10 depicted in FIGS. 9 and 10 may thereby be electrically. connected to another device (not shown), by way of the ball connections 28" and 48", respectively. It will be appreciated by one of average and ordinary skill in the art that the embodiment of the relay 10 shown in FIGS. 9 and 10 further includes plated through hole 58 and ball connection 59. The design and fabrication of these electromechanical structures is otherwise identical to that of the plated through holes 72 and 73 and ball connections 28" and 48" described above. It will further be appreciated that the array of ball connections 28", 48", and 58 are referred to collectively as a ball grid array interface 61.

It will further be appreciated that the alternate constructions of the SPST relay devices shown in FIGS. 7–10 may be fabricated to include a permanent magnet (not shown) oriented adjacent to and above magnetic material 55, to aid in the reciprocation of the moving contact (42, 42') between the open and closed positions. Those of average and ordinary skill in the art will appreciate that the operation of such a permanent magnet has otherwise been described above with regard to the embodiments as depicted in FIGS. 17–22.

Figure 11:
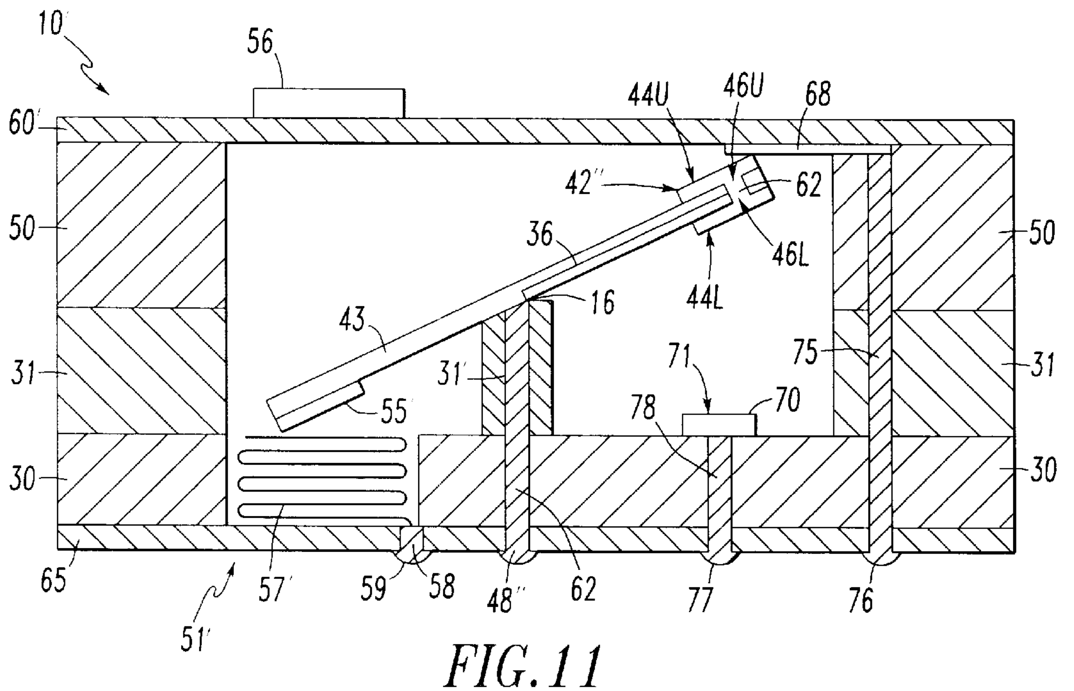
FIG. 11 is a partial cross-sectional side view of another embodiment of the present invention that comprises a single-pole double-throw relay device fabricated using a method of the present invention, and having ball-grid array input/output connections and a cover, shown in a first position.
Figure 12:
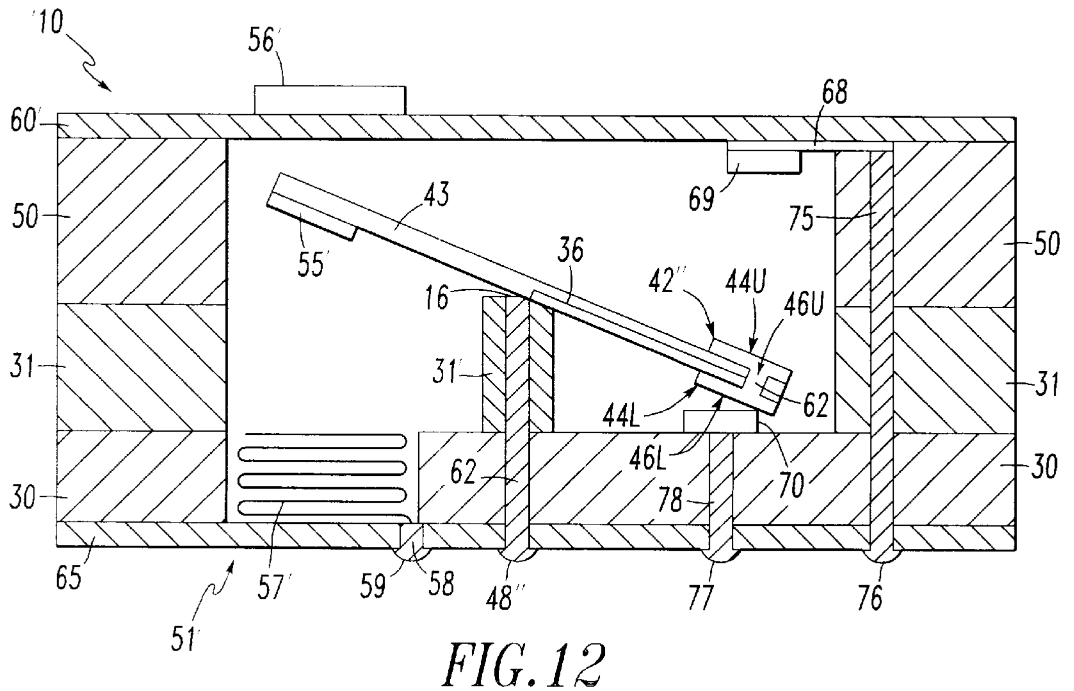
FIG. 12 is a side partial cross-sectional view of the relay device shown in FIG. 11, shown in a second position.

As shown in FIGS. 11–13, the present invention may be employed to fabricate an embodiment of a single-pole double-throw (SPDT) laminate-based relay 10'. The SPDT relay 10' depicted in FIGS. 11–13 generally includes upper and lower stationary contacts 68 and 70, respectively, and a;moving contact 42". Upper stationary contact 68 is formed on a cover layer 60'. The cover layer 60' is adapted to shield the relay 10' from environmental factors and may be formed from a material such as, for example, one of the materials mentioned above with regard to first layer 20. The construction of upper stationary contact 68 may additionally include an upper stationary contact overlay 69. The design and operation of upper stationary contact overlay 69 is similar to that of stationary contact overlay 26 described above. Lower stationary contact 70 is formed on intermediate layer 30'. Intermediate layer 30' may be formed from, for example, the materials and processes described above with regard to intermediate layer 30. Lower stationary contact 70 may include a lower stationary contact overlay 71. The design and operation of lower stationary contact area overlay 71 is similar to that of stationary contact area overlay 26 described above. It will be appreciated that the design and operation of upper and lower stationary contacts 68 and 70, respectively, is otherwise identical to that of the stationary contact 22 described above.

Moving contact 42" includes an arm 43. The arm 43 is formed from a layer of dielectric material, such as a panel of printed circuit board material described above with regard to the first and second layers 20 and 40, respectively. Arm 43 is pivotally mounted on a hinged portion 16 formed on intermediate layer 31. Intermediate layer 31 may include, for example, a layer of dielectric material, such as that described above with regard to intermediate layers 30 and 50. Portions of dielectric material layers 30 and 31 have been removed, for example, through fabrication techniques already described herein, to create air gaps on either side. The air gaps allow arm 43 to be pivoted between a first position (see FIG. 11) and a second position (see FIG. 12. Hinged portion 16 thereby forms a fulcrum atop pedestal 31' on which arm 43 is pivotally mounted.

Moving contact 42" additionally includes upper moving contact area 44U and lower moving contact area 44L. In particular, arm 43 is typically clad on both sides with layer of electrically conductive material, such as that described above with regard to layer 21, and upper and lower moving contact areas 44U and 44L, respectively, are patterned and formed directly therefrom. Moving contact area 44U and 44L, respectively may additionally include upper and lower moving contact area overlays 46U and 46L, respectively, disposed on upper and lower moving contact areas 44U and 44L, respectively. The upper and lower moving contact area overlays 46U and 46L, respectively, of the moving contact 42" are typically electrically interconnected via a plated through hole 62 in the arm 43. It will be appreciated that the composition and materials from which the moving contact 42" is constructed are the same as those used for moving contact 42, described above. In addition, it will be appreciated that the composition and material from which the moving contact area overlays 46U and 46L are constructed is the same as those used for moving contact area overlay 46, described above.

The pivoting motion of arm 43 about hinge 16 permits moving contact 42" to move between a position in which it is in electrical contact with the upper stationary contact 68 (See FIG. 11) and a position in which it is in electrical contact with the lower stationary contact 70 (See FIG. 12). An actuating mechanism 51' is typically provided to control the movement of moving contact 42" between these positions. In particular, actuating mechanism 51' generally includes conductor coil 57', permanent magnet 55', and magnet material 56'. Conductor coil 57' may be formed within intermediate layer 30 as described above with respect to the embodiment shown in FIGS. 1–6. Permanent magnet 55' is typically formed at the opposite end of arm 43 from moving contact 42". Magnetic material 56' may be formed atop cover layer 60', for example, adjacent to the end of arm 43 at which permanent magnet 55' is located. In operation, the magnetic field (not shown) produced by permanent magnet 55' causes the permanent magnet 55' to be attracted to magnetic material 56 to thereby cause arm 43 to pivot into a first position (see FIG. 12). However, when an electric current is passed through electrically conducting coil 57', a magnetic field (not shown) is created. The magnetic field created by the electrically conducting coil 57' is of sufficient strength to overcome the magnetic field produced by permanent magnet 55' and thus causes arm 43 to pivot into a second position (See FIG. 11). It will be understood that, when the current to electrically conducting coil 57' is eliminated, the magnetic field produced thereby is dissipated and arm 43 is again pivoted into the first position (see FIG. 12).

In the second position (see FIG. 11), arm 43 is positioned such that the upper moving contact area overlay 46U is in electrical contact with the upper stationary contact 68. In the first position (see FIG. 12), the arm 43 is positioned such that the lower moving contact area overlay 46L is in electrical contact with the lower stationary contact 70. As such, it will be appreciated by the skilled artisan that, in either of the first or second positions, current will be allowed to pass through the SPDT relay 10'. In particular, in the first position, current will pass from moving contact 42" to upper stationary contact 68 and be available at electrical contact 76. In the second position, current will pass from moving contact 42" to lower stationary contact 70 and be available at electrical contact 77.

The input and output connections respectively of the relay 10' shown in FIGS. 11 and 12, may be accomplished, for example, via a series of plated through holes and a ball grid array. In particular, each of the electrical contacts 48", 59, 76, and 77 are shown in the Figures as a ball contact. In addition, each of the electrical contacts 48", 59, 76, and 77 are shown in the Figures to be electrically connected to a particular electromechanical structure of the relay 10' by way of a plated-through hole 62, 58, 75, and 78, respectively. In particular, upper stationary contact 68 is electrically connected to ball connection 76 through plated through hole 75. Lower stationary contact 70 is electrically connected to ball connection 77 through plated through hole 78. Upper and lower moving contact areas 44U and 44L, respectively, are electrically connected, by electrical connection 36, to plated through hole 62, which is itself electrically connected to ball connection 48". A plated through hole 58 and ball connection 59 is also used to form an electrical connection for conductor coil 57'. It will be appreciated that the design and fabrication of the plated through holes 58, 73, 75, and 78 and their corresponding ball connectors 59, 74, 76, and 77, respectively, are identical to that of plated through holes and ball connections described earlier with regard to SPST relay 10 depicted in FIGS. 9 and 10 above. It will further be appreciated that the electrical connection 36 may include, for example, an electrically conductive wire or plated through hole within arm 43.

FIGS. 14 and 15 show yet another embodiment of a relay fabricated using the present laminate based fabrication method. As shown in FIGS. 14 and 15, the relay 10" employs a microstrip construction. In particular, electrical connections 28' and 48' are provided to electrically connect stationary contact 22 and moving contact 42 to other devices or components. Actuation mechanism 51 includes a conductor coil 57 and magnetic material 56. The actuation mechanism 51 is capable of generating a magnetic field of sufficient strength, in the open state, to separate stationary contact 22 from moving contact 42 such that an air gap 14' is thus created and suitable electrical signal isolation is achieved between the moving contact 42 and the stationary contacts 22. In the closed state, it will be appreciated that the materials from which moving contact 42 and stationary contact 22 are fabricated may be chosen to form an inpedance match between the stationary contact 22 and the moving contact 42 and to thereby provide a controlled impedance structure. While the embodiment shown in FIGS. 14 and 15 is based on a microstrip construction, one of average skill in the art will appreciate that other embodiments having, for example, co-planar waveguide, stripline, and other configurations known in the art may also be fabricated using the present laminate-based fabrication technique.

Figure 16:
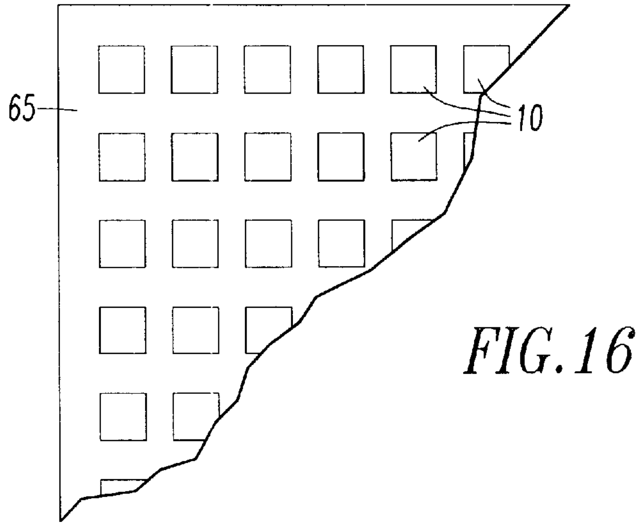
FIG. 16 is a partial plan view of a panel of laminate material containing multiple relays, fabricated by a method of the present invention.
Figure 17:
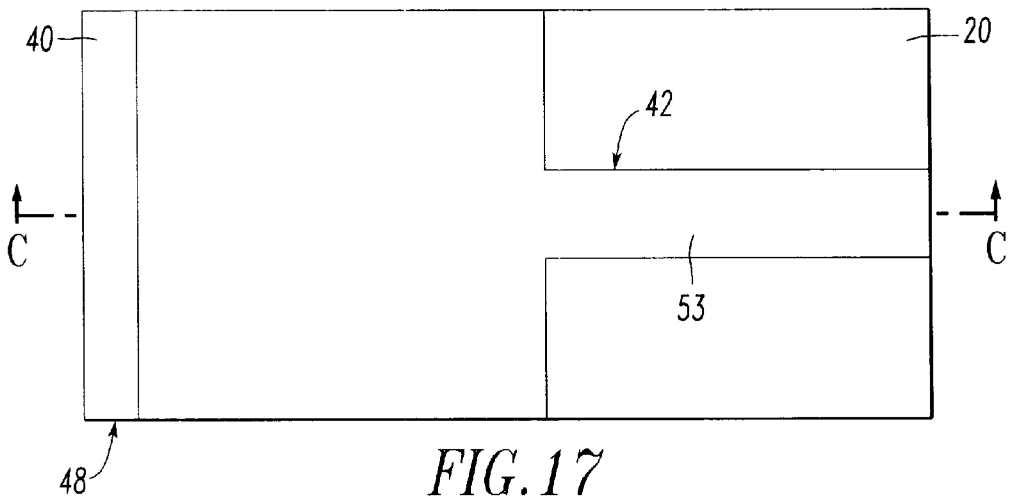
FIG. 17 is a top view of another embodiment of the present invention that comprises a single-pole single-throw relay device, provided with input/output connections and a permanent magnet, fabricated using a method of the present invention.
Figure 18:
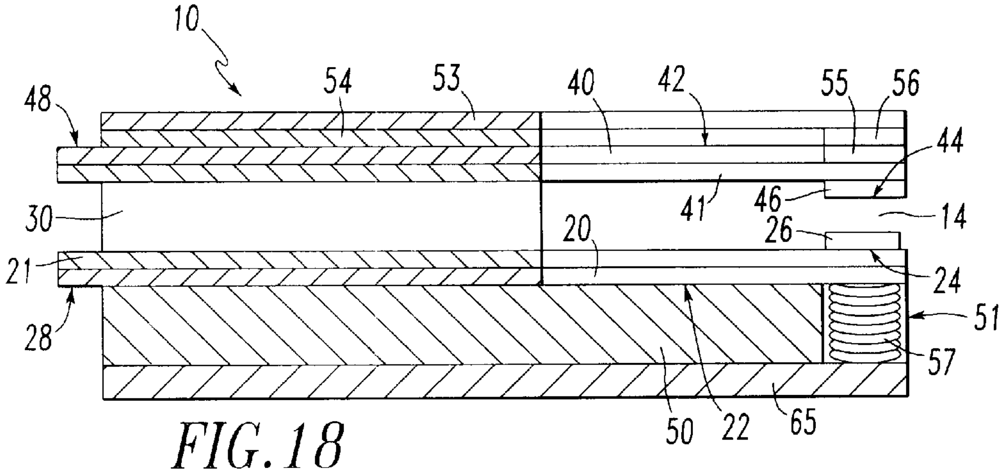
FIG. 18 is a partial cross-sectional side view, taken along the line C—C in FIG. 17, of the embodiment of the relay device shown in FIG. 17, shown in an open position.
Figure 19:
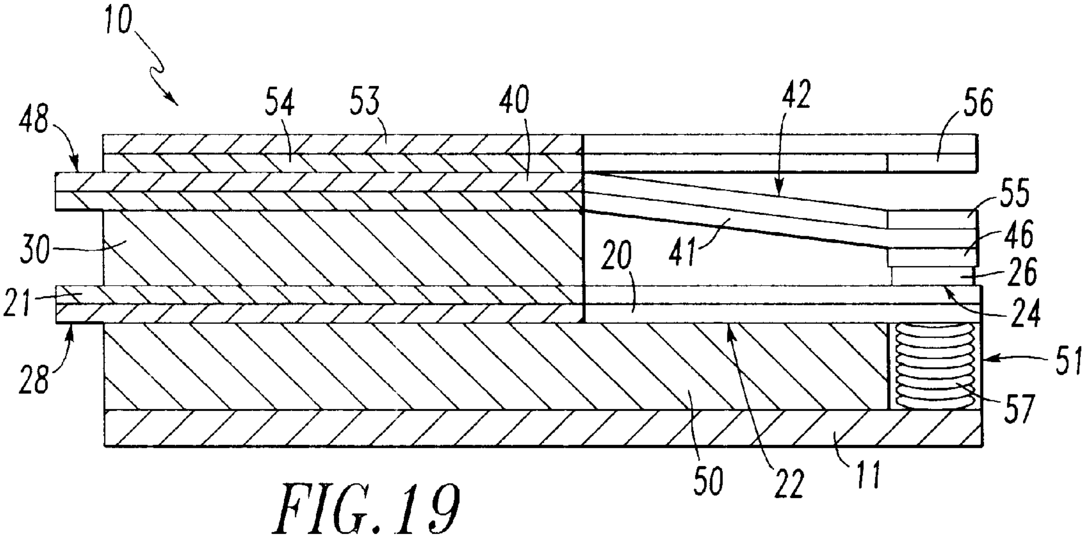
FIG. 19 is a partial cross-sectional side view, taken along the line C—C in FIG. 17, of the relay device shown in FIG. 17, and shown in a closed position.
Figure 20:
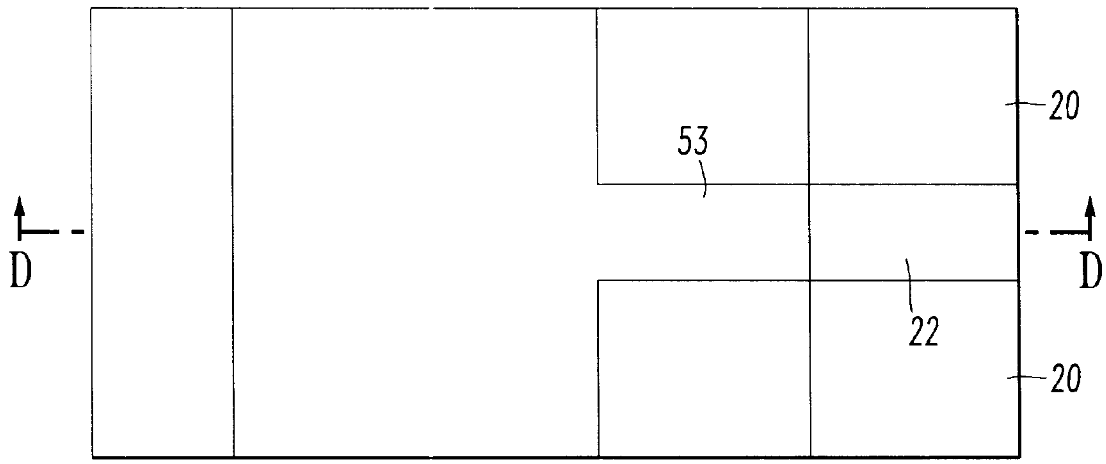
FIG. 20 is a top view of another embodiment of the present invention that comprises a single-pole single-throw relay device, provided with input/output connections and a permanent magnet, fabricated using a method of the present invention.
Figure 21:
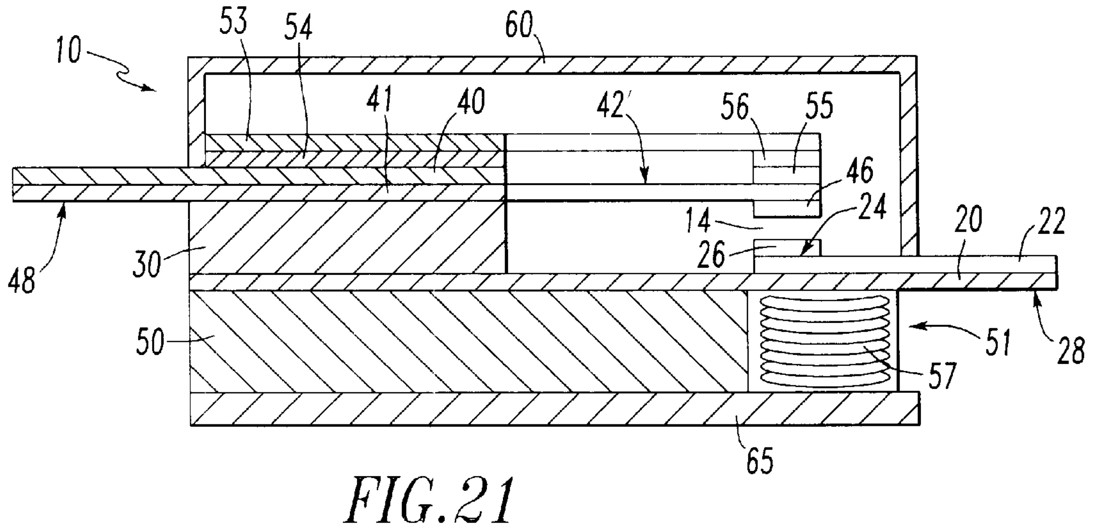
FIG. 21 is a partial cross-sectional side view, taken along the line D—D in FIG. 20, of the embodiment of the relay device shown in FIG. 20, shown in an open position.
Figure 22:
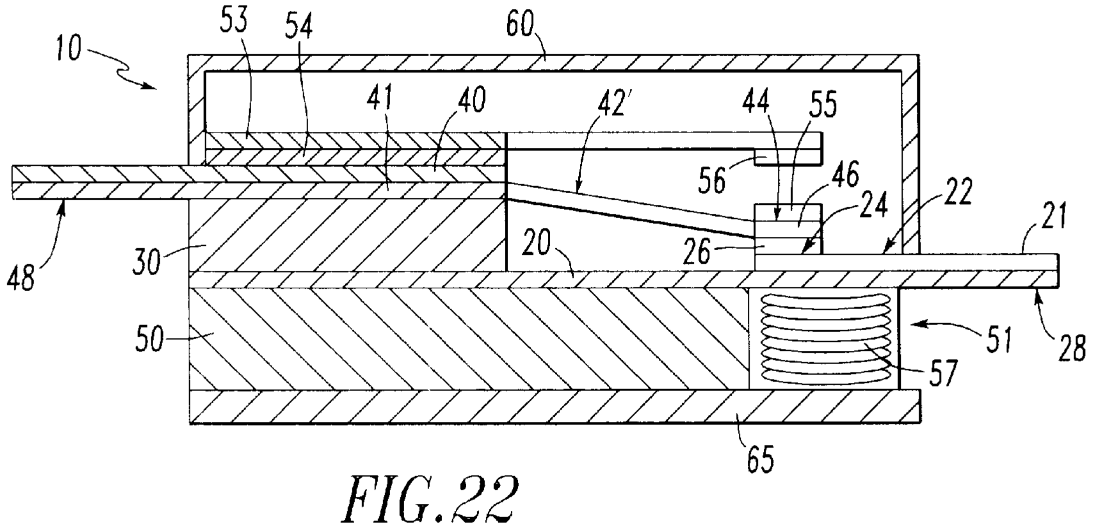
FIG. 22 is a partial cross-sectional side view, taken along the line D—D in FIG. 20, of the relay device shown in FIG. 20, and shown in a closed position.

As shown in FIG. 16, an advantage provided by the present invention is the ability to simultaneously fabricate multiple laminate-based electromechanical devices in a single batch. Accordingly, as with semiconductor and MEMS fabrication, once fabrication is complete, the devices may then be divided or diced. However, unlike semiconductor and MEMS devices, the devices of the present invention can be diced into any number of desired configurations, yielding, for example, individual devices, such as the described relays above, or electrically connected groups of devices (not shown). It will be further understood that the latter possibility will permit multiple electrically interconnected devices to be fabricated in a single monolithic package. Alternatively, individual devices may be interconnected laterally in various configurations on the panel to create matrices (not shown). It will also be appreciated that other embodiments, such as those including vertical integration of the relays (or other electromechanical devices), are also possible by adding additional layers of laminate material. Embodiments of such a vertical integrated device include, for example, an SPDT relay (as shown in particular in FIGS. 11–13) a Double-Pole Double-Throw (DPDT) relay (not shown).

Also, while not required by the electromechanical devices the present invention, it will be further appreciated that wires (not shown) bonded to the laminate layers of the devices or lead frames (not shown) attached to the laminate layers of the devices may alternatively be utilized to provide electrical connections for the electromechanical laminate-based relay devices of the present invention.

Referring again to FIGS. 1–4 for purposes of illustrating, in practice, the present laminate-based method of fabrication, the first layer 20 of the laminate structure of the laminate based electromechanical relay 10 is clad onto at least one side with a layer 21 of electrically conducting material. The layer 21 of electrically conductive material may be, for example, patterned on the first layer 20 and then etched therefrom to form conductors thereon, including at least one stationary contact 22. The stationary contact area overlay 26 is provided on the stationary contact 22 by plating stationary contact 22 with an electrically conductive material. In particular, the stationary contact area overlay 26 may be formed, for example, as a bump or build-up of one of the electrically conductive materials detailed above, on the stationary contact 22.

The first intermediate layer 30 of printed circuit board material is then positioned atop first layer 20. A portion of intermediate layer 30 adjacent to the stationary contact 22 is then removed by, for example, a mechanical or chemical process, such as die cutting, laser cutting, ablation, or etching to provide for the air gap 14 between the stationary contact 22 and the moving contact 42. In an alternative, it will be appreciated by one of average and ordinary skill in the art that the air gap 14 may be formed in first intermediate layer 30 prior to the addition of first intermediate layer 30 to first layer 20 and, using processes such as those described above, the first intermediate layer 30 may be added atop first layer 20.

The second layer 40 of printed circuit board material that has a layer 41 of electrically conducting material clad on to one side thereof is then positioned atop first intermediate layer 30. Portions of the second layer 40 and layer 41 of electrically conducting material are patterned and removed using, for example, mechanical or chemical process, as described above, to define conductors thereon, including at least one moving contact 42. Moving contact 42 is thereby formed as a cantilevered beam that overhangs stationary contact 22. The contact area 44 of moving contact 42 is plated with an electrically conductive material, examples of which are detailed above, to form moving contact overlay 46. In particular, the moving contact overlay 46 may be formed, for example, as a bump or build-up of one of the electrically conductive materials detailed above on the surface of moving contact 42.

In addition, magnetic material 55 is provided atop moving contact 42 adjacent to moving contact area 44. The magnetic material 55 may be fabricated, for example, by depositing a layer of magnetic material 55 atop second layer 40 and then removing portions of the layer of magnetic material using processes such as those described above, to form magnetic material 55.

Second intermediate layer 50 is positioned below first layer 20. A portion of the second intermediate layer 50 is removed and a deposit of an electrically conducting material is placed therein, all using fabrication techniques described herein. Conductor coils 57 of actuating mechanism 51 are then patterned and etched within the second intermediate layer 50 from the electrically conducting material, adjacent to and below stationary contact area 24.

Permanent magnet 56 is included in certain of the embodiments contained herein to provide an additional restoring force to aide the actuating mechanism 55 in affecting the actuation of the moving contact 42. In such an embodiment, additional layer 53 is positioned atop the second layer 40, the additional layer 53 may be separated from the second layer 54 by a dielectric spacer layer 54. The permanent magnet 56 may be fabricated by etching away a portion of additional layer 53 and depositing and patterning permanent magnet 56 therein atop the additional layer 53, using processes such as those described above.

Additional layers of material may be positioned atop second of layer 40 to form a cover 60 to provide protection for the contacts 22 and 42 from the environment in which the relay device 10 is to be used. Further, a ground plane 65 may be positioned to second intermediate layer 50, for example, from an additional panel of printed circuit board material, to act as an electrical ground for the relay 10.

Once fabrication of each of the individual layers of printed circuit board material that form the laminate structure of the relay device 10 is completed, the layers are stacked in an appropriate sequence and subjected to a lamination process to bond the individual layers into the unitary structure of the relay device 10. The process of lamination used to bond the individual layers may be, for example, that which is utilized in printed circuit board manufacturing. In such case, the lamination procedure will include the application of heat and pressure to the stack of panels until they have been bonded into a single unitary three-dimensional laminate structure. In an alternative embodiment, layers of adhesive bond films may be introduced between the individual panels to increase the integrity of the resultant unitary laminate structure of the relay device 10. The adhesive bond film may consist of an adhesive used in printed circuit board construction, for example, layers of epoxy coated glass fabric (known in the industry as "prepreg"). However, it will be appreciated that the identity and composition of the adhesive bond film will vary depending upon the particular operational needs required of the relay device 10 and upon the particular organic-dielectric material forming the laminate layers of the relay device 10.

After bonding of the layers to form the body of the relay device 10, electrical interconnections between the conductors in the various layers within the relay device 10 may be fabricated. In particular, in the case of the plated-through holes described above, holes are bored through the laminate layers by, for example, means of mechanical, laser, or plasma drilling techniques known in the art. The holes are then plated with an electrically conductive material to form electrical interconnections between the conductors in the different layers of the laminate structure. Connections such as the ball connections described above, may then be added to the plated through holes to form the points of electrical connections.

In the above-described embodiments of the electromechanical delay devices and methods of the present invention fabrication processes are performed, for example, on individual panels of printed circuit board material to form the component electromechanical structures of the relay device 10 and the layers are then stacked to form the structure of the relay 10. The stacked panels are then laminated to form a unitary three dimensional laminate structure. However, it will be appreciated by the skilled artisan that the present invention also includes the process whereby panels of printed circuit board material are stacked and laminated to form a unitary three-dimensional laminate structure and the individual fabrication processes detailed above are then performed on the three-dimensional laminate structure to form the electromechanical structures of the relay device 10. It will further be appreciated that the methods of the present invention also includes variations wherein which fabrication processes are performed on certain of the layers of the laminate structure before stacking and lamination and on others after stacking and lamination has occurred.

As noted above, the present invention includes the use of both additive and subtractive processing techniques otherwise know in the art of semiconductor and printed circuit board manufacture. Additive processing techniques, in which successive layers of dielectric material are added to the layers of printed circuit board material may include, for example, the use of screen printing, photoresist sheets, and liquid photo-imageable materials to successively add layers of material to the laminate panel. Subtractive techniques in which selected portions of layers of the structure are removed to form the relay device, may include, for example, the use of ablation, drilling, etching, and other techniques mentioned. It will be appreciated that additional additive and subtractive techniques known in the art of printed circuit board manufacturing may be used in place of, in conjunction with, or in addition to those particular methods mentioned herein. It will be further appreciated that the fabrication techniques detailed above may also be used in various combinations, other than those in particular combinations described above.

Upon completion of the fabrication of the electromechanical structures of the laminate-based relay device described above, the panel on which the relays have been fabricated is typically diced to yield a plurality of individual relays or other devices. As described above, the laminate-based relay devices of the present invention may be fabricated such that no ancillary package or packaging step is required. Unlike semiconductor and MEMs devices, each laminate-based relay may incorporate an integral set of electrical contacts to permit subsequent surface mounting of the relay directly onto a printed circuit board or other component structure. Accordingly, it will be appreciated that the devices of the present invention may be designed such that they do not exhibit significant mismatches in the coefficient of thermal expansion with respect to the surface mount board due to the fact that the body of the relay is constructed from printed circuit board material. However, it will further be appreciated that the individual relays of the present invention may alternatively be packaged on lead frames, chip carriers, or in other packages, should the circumstances in which the relay is to be used require such packaging.

In an alternative embodiment, upon completion of the fabrication of the electromechanical structures of the laminate-based relay device described above, the panel may be embedded directly into a multi-layer printed circuit board. In particular, additional layers of printed circuit board material are laminated with the panel on which the relays or other laminate-based devices have been fabricated using conventional printed circuit board fabrication techniques known in the art. Such additional layers may be of identical material and construction as that of the panel on which the relays or other laminate-based devices have been fabricated or may employ various other materials and construction techniques as are known in the art. The additional layers are typically adapted to provide mounting locations for other electrical components and/or electrical interconnections between these components. Additional electronic components of various types known in the art may thus be assembled on the multi-layer printed circuit board. It will be understood by those of average and ordinary skill in the art that such an embodiment would have the advantage of significantly improved volumetric efficiency since the laminate-based relays would occupy a proportionately small portion of the surface area of the multi-layer board and would increase the thickness of the board by only a modest amount.

Those of ordinary skill in the art will thus appreciate that a number of modifications and variations can be made to specific aspects of the methods and apparatuses of the present invention without departing from the scope of the present invention. Such modifications and variations are encompassed by the foregoing specification and the following claims. Furthermore, although the foregoing description of embodiments of the invention references a laminate-based relay, it will be understood that the methods of the present invention may be used to fabricate other laminate-based electromechanical devices including, for example, motors, actuators, and sensors. It will additionally be understood that any such laminate-based devices constructed according to the methods of the present invention, including, for example, relays, motors, actuators, and sensors, are hereby encompassed by the present invention.

What is claimed is:

1. A method of fabricating a laminate-based electromechanical relay device, comprising:

providing at least one first layer of laminate having at least one layer of electrically conductive material adherent thereto;

forming at least one stationary contact from the at least one layer of electrically conductive material;

providing at least one intermediate layer of laminate adjacent to the first layer of laminate;

providing at least one second layer of laminate atop the at least one intermediate layer, the at least one second layer having at least one layer of electrically conductive material adherent thereto;

removing a portion of the at least one intermediate layer adjacent to the at least one stationary contact to form an air gap between said at least one first layer and at least one second layer;

forming at least one moving contact from the at least one second layer and the at least one layer of electrically conductive material adherent thereto, the at least one moving contact adjacent to the air gap, such that the at least one second layer and the at least one layer of electrically conductive material adherent thereto are deflectable such that the at least one moving contact is capable of contacting the stationary contact;

stacking the at least one first, intermediate, and second layers in an order to provide a stack; and bonding the stack to form a unitary laminate body.

2. The method of claim 1, wherein said forming the at least one stationary contact further comprises fabricating at least one moving contact from the at least one layer of electrically conductive material and the at least one first layer using a sequence of at least one additive fabrication step and at least one subtractive fabrication step.

3. The method of claim 2, wherein the electrically conductive material is selected from the group consisting of copper, silver, nickel, gold, and alloys thereof, and the at least one first layer further comprises an organic dielectric laminate selected from the group consisting of epoxy, polyimide, epoxy-glass laminate, polytetrafluoroethylene, cyanate ester, and liquid crystal polymer.

4. The method of claim 2, wherein said at least one additive fabrication step is selected from the group consisting of deposition, plating, screen printing, photo definition, photo imaging, and photo resistance.

5. The method of claim 4, wherein said at least one subtractive fabrication step is selected from the group consisting of etching, ablation and drilling.

6. The method of claim 5, wherein said forming at least one moving contact further comprises fabricating at least one moving contact from the at least one layer of electrically conductive material and the at least one second layer using a sequence of additive and subtractive fabrication techniques.

7. The method of claim 6, wherein the electrically conductive material is selected from the group consisting of copper, silver, nickel, gold, and alloys thereof, and the at least one second layer further comprises an organic dielectric laminate selected from the group consisting of epoxy, polyimide, epoxy-glass laminate, polytetrafluoroethylene, cyanate ester, and liquid crystal polymer.

8. The method of claim 1, further comprising plating the at least one stationary contact with an electrically conductive material selected from the group consisting of gold, silver, ruthenium, rhodium, and alloys thereof.

9. The method of claim 1, further comprising plating the at least one moving contact with an electrically conductive material selected from the group consisting of gold, silver, ruthenium, rhodium, and alloys thereof.

10. The method of claim 1, further comprising providing an actuator that selectively urges at least one moving contact into contact with at least one stationary contact.

11. The method of claim 10, wherein said providing an actuator comprises:

providing at least one third laminate layer of adjacent to the at least one second layer;

forming an electrically conductive coil within the at least one third laminate layer; and providing at least one magnetic material on the at least one moving contact.

12. The method of claim 11, further comprising providing a ground plane adjacent to at least one third layer.

13. The method of claim 11, wherein said providing at least one second layer further comprises providing at least one fourth and fifth layer of organic dielectric laminate.

14. The method of claim 13, wherein said providing the at least one fourth layer further comprises providing at least one permanent magnet in the fourth layer adjacent to the at least one magnetic material.

15. The method of claim 14, wherein the at least one fifth layer is provided adjacent to the at least one fourth layer.

16. The method of claim 1, further comprising:

providing at least one first electrical connector in electrical connection with at least one layer of electrically conductive material adherent to at least one first layer; and providing at least one second electrical connector in electrical connection with at least one layer of electrically conductive material adherent to at least one second layer.

17. The method of claim 16, wherein said providing at least one first electrical connector further comprises adapting at least one layer of electrically conductive material adherent to the first layer to extend beyond a periphery of the unitary laminate body, and wherein said providing at least one second electrical connector further comprises adapting at least one layer of electrically conductive material adherent to the second layer to extend beyond the periphery of the unitary laminate body.

18. The method of claim 16, wherein said providing at least one first electrical connector and said providing at least one second electrical connector further comprise electrically connecting at least one of the at least one layer of electrically conductive material adherent to the first layer and at least one layer of electrically conductive material adherent to the second layer to at least one lead wire.

19. The method of claim 16, wherein said providing at least one first electrical connector and said providing at least one second electrical connector further comprise electrically connecting at least one layer of electrically conductive material adherent to the first layer and at least one layer of electrically conductive material adherent to the second layer to at least one lead frame.

20. The method of claim 16, wherein said providing at least one first electrical connector and said providing at least one second connector further comprises electrically connecting at least one layer of electrically conductive material adherent to the first layer and connecting at least one layer of electrically conductive material adherent to the second layer to a ball grid array.

21. The method of claim 1, wherein said bonding further comprises applying an amount of heat and pressure to the stack.

22. The method of claim 1, wherein said stacking the layers further comprises inserting adhesive between the layers comprising the stack and said bonding comprises applying an amount of heat and pressure to the stack until the layers of the stack.

23. A method of fabricating an electromechanical relay device, the method comprising:

providing at least one first layer of laminate having at least one first layer of electrically conductive material adherent thereto;

providing at least one intermediate layer of laminate;

providing at least one second layer of laminate having at least one second layer of electrically conductive material adherent thereto;

orienting the first, intermediate, and second layers in an order to provide a stack;

bonding the stack to form a unitary laminate body;

forming at least one stationary contact in the unitary laminate body;

forming at least one air gap in the unitary laminate body; and forming at least one moving contact in the unitary laminate body, such that a portion of the unitary laminate body is deflectable such that the at least one moving contact is capable of contacting the stationary contact.

24. The method of claim 23, wherein:

the at least one stationary contact is formed from the at least one layer of electrically conductive material;

the at least one air gap is formed by removing a portion of the intermediate layer that lies adjacent to the at least one stationary contact; and the at least one moving contact is formed from the at least one second layer of electrically conductive material.

25. The method of claim 24, wherein said forming at least one moving contact further comprises fabricating at least one moving contact from the at least one second layer of electrically conductive material.

26. The method of claim 24, wherein said forming the at least one moving contact further comprises fabricating at least one selectively moveable contact from the at least one second layer of electrically conductive material.

27. The method of claim 24, further comprising providing an actuator adapted to urge the moving contact into contact with the stationary contact.

28. The method of claim 27, wherein said providing an actuator further comprises:

providing at least one third layer of laminate below the at least one second layer of organic dielectric laminate;

forming an electrically conductive coil within at least one third layer of laminate;

providing at least one magnetic material on the at least one moving contact; and selectively energizing said electrically conductive coil to cause at least one moving contact to contact at least one stationary contact.

29. The method of claim 28, further comprising providing a ground plane below the at least one third layer of dielectric laminate.

30. The method of claim 24, further comprising:

providing at least one first electrical connector in electrical connection with the at least one first layer of electrically conductive material; and providing at least one second electrical connector in electrical connection with the at least one second layer of electrically conductive material.

31. The method of claim 30, wherein said providing at least one first electrical connector and said providing at least one second electrical connector further comprise extending at least one of the at least one first layer of electrically conductive material and extending at least one of the at least one second layer of electrically conductive material beyond a periphery of the unitary laminate body.

32. The method of claim 30, wherein said providing at least one first electrical connector and said providing at least one second connector further comprise electrically connecting at least one of the at least one first layer of electrically conductive material and connecting at least one of the at least one, second layer of electrically conductive material to a,ball grid array.

33. The method of claim 24, wherein said bonding comprises applying an amount of heat and pressure to the stack until the layers of the stack bond to form the integral laminate body.

* * * * *

UNITED STATES PATENT AND TRADEMARK OFFICE

CERTIFICATE OF CORRECTION

PATENT NO. : 6,410,360 B1
DATED : June 25, 2002
INVENTOR(S) : Robert W. Steenberge It is certified that error appears in the above-identified patent and that said Letters Patent is hereby corrected as shown below:

Column 5,
Line 23, delete “de position” and replace with -- deposition --.

Column 14,
Line 8, delete the semicolon between “a” and “moving”.

Signed and Sealed this

Fourth Day of February, 2003

JAMES E. ROGAN
*Director of the United States Patent and Trademark Office*